United States Patent
Baek et al.

(10) Patent No.: US 12,431,997 B2
(45) Date of Patent: Sep. 30, 2025

(54) MULTIPLEXER AND SERIALIZER INCLUDING THE SAME

(71) Applicant: SAMSUNG ELECTRONICS CO., LTD., Suwon-si (KR)

(72) Inventors: Jaehyeok Baek, Suwon-si (KR); Daehyun Kwon, Suwon-si (KR); Saetbyeol Kim, Suwon-si (KR); Hye-Ran Kim, Uiwang-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 890 days.

(21) Appl. No.: 17/680,787

(22) Filed: Feb. 25, 2022

(65) Prior Publication Data

US 2023/0006750 A1 Jan. 5, 2023

(30) Foreign Application Priority Data

Jul. 5, 2021 (KR) .................. 10-2021-0087760

(51) Int. Cl.
*H04J 3/04* (2006.01)
*H03K 17/687* (2006.01)
*H03K 19/20* (2006.01)

(52) U.S. Cl.
CPC ............ *H04J 3/04* (2013.01); *H03K 17/6872* (2013.01); *H03K 19/20* (2013.01)

(58) Field of Classification Search
CPC ....... H03K 17/6872; H03K 19/018507; H03K 19/0948; H03K 19/1737; H03K 19/20; H04J 3/04; H04J 3/047

USPC .......................................................... 370/329
See application file for complete search history.

(56) References Cited

U.S. PATENT DOCUMENTS

| | | | |
|---|---|---|---|
| 6,212,229 B1 | 4/2001 | Salinger | |
| 7,586,987 B2 | 9/2009 | Vorenkamp et al. | |
| 8,243,847 B2 | 8/2012 | Dally | |
| 8,860,468 B1* | 10/2014 | Khandelwal | G06F 1/08 327/99 |
| 10,560,097 B1* | 2/2020 | Peng | H04L 7/033 |
| 10,637,509 B2 | 4/2020 | Shih | |
| 2005/0024243 A1* | 2/2005 | Kim | H03M 9/00 341/101 |
| 2011/0026334 A1 | 2/2011 | Bae et al. | |
| 2014/0044160 A1 | 2/2014 | Lee | |

(Continued)

FOREIGN PATENT DOCUMENTS

| | | |
|---|---|---|
| KR | 10-0293923 B1 | 7/2001 |
| KR | 10-1642831 B1 | 7/2016 |

*Primary Examiner* — Robert J Lopata
(74) *Attorney, Agent, or Firm* — Fish & Richardson P.C.

(57) ABSTRACT

A multiplexer selects one of a first to a fourth data signal in response to a first to a fourth pulse. The first to fourth pulses respectively correspond to the first to fourth data signals and sequentially toggle. The multiplexer includes: (1) a NAND gate that receives the first data signal, a fourth complementary data signal that is a complementary signal of the fourth data signal, and the first pulse and outputs a first gate signal and (2) a NOR gate that receives the first data signal, the fourth complementary data signal, and a first complementary pulse that is complementary to the first pulse and outputs a second gate signal. The first data signal corresponds to a rising edge of the first pulse, and the fourth complementary data signal corresponds to a rising edge of the fourth pulse.

20 Claims, 10 Drawing Sheets

(56) References Cited

U.S. PATENT DOCUMENTS

| | | | |
|---|---|---|---|
| 2016/0218753 A1* | 7/2016 | Fiedler | H03K 19/0005 |
| 2021/0167781 A1* | 6/2021 | Nagarajan | H03K 19/0948 |
| 2021/0295934 A1* | 9/2021 | Dozaka | H03K 19/20 |

* cited by examiner

MULTIPLEXER AND SERIALIZER INCLUDING THE SAME

CROSS-REFERENCE TO RELATED APPLICATIONS

This application claims priority under 35 U.S.C. § 119 to Korean Patent Application No. 10-2021-0087760 filed on Jul. 5, 2021, in the Korean Intellectual Property Office, the disclosure of which is incorporated by reference herein in its entirety.

BACKGROUND

Embodiments of the present disclosure described herein relate to a multiplexer included in a high-speed serial communication system and a serializer including the same.

In a high-speed serial link system, data bits may be transmitted in series through a channel. In the case where a signal is transmitted through a channel such as a coaxial cable or a PCB trace, the bandwidth of the channel may be restricted due to a load, a skin effect, and a dielectric loss of the channel and a high-frequency component of a signal may weaken at a receiver. In particular, the reliability of the high-speed serial link system may decrease due to inter symbol interference (ISI) that is a form of distortion of a signal in which one symbol interferes with subsequent symbols.

For example, the ISI may increase at a rising edge or a falling edge at which there is quickly changed a voltage level of a signal of high-frequency components. In this case, the signal output from a transmitter may be distorted or a time during which the signal is transferred to the receiver may vary depending on a frequency.

SUMMARY

Embodiments of the present disclosure provide a multiplexer and a serializer including the same.

According to an embodiment, a multiplexer selects one of a first to a fourth data signal in response to a first to a fourth pulse, the first to fourth pulses respectively correspond to the first to fourth data signals and sequentially toggle. The multiplexer may include a NAND gate that outputs a first gate signal in response to receiving the first data signal, a fourth complementary data signal that is a complementary signal of the fourth data signal, and the first pulse. A NOR gate outputs a second gate signal in response to receiving the first data signal, the fourth complementary data signal, and a first complementary pulse complementary to the first pulse. A first transistor includes a first terminal to which a first power supply voltage is applied, a gate that receives the first gate signal, and a second terminal connected with an output terminal of the multiplexer. A second transistor that includes a first terminal connected with the output terminal of the multiplexer, a gate that receives the second gate signal, and a second terminal to which a ground voltage is applied. The first data signal may correspond to a rising edge of the first pulse, and the fourth complementary data signal may correspond to a rising edge of the fourth pulse.

According to an embodiment, a serializer may include a clock multiplexer that generates first to fourth pulses based on first to fourth clocks. The first to fourth clocks have a phase difference of 90 degrees with each other, and the first to fourth pulses toggle sequentially. A multiplexer outputs an output signal, which is based on a first to a fourth data signal, in response to the first to fourth pulses and first to fourth complementary pulses respectively complementary to the first to fourth pulses. The first to fourth data signals correspond to the first to fourth pulses, respectively. The multiplexer may include a NAND gate that outputs a first gate signal in response to receiving the first data signal, a fourth complementary data signal complementary to the fourth data signal, and the first pulse. A NOR gate outputs a second gate signal in response to receiving the first data signal, the fourth complementary data signal, and a first complementary pulse complementary to the first pulse. A level of the output signal may be based on the first gate signal and the second gate signal.

According to an embodiment, a serializer may include a clock multiplexer that generates first to fourth pulses based on first to fourth clocks, the first to fourth clocks having a phase difference of 90 degrees with each other and the first to fourth pulses toggling sequentially. A multiplexer outputs an output signal, which is based on a first to a fourth data signal, in response to the first to fourth pulses and first to fourth complementary pulses respectively complementary to the first to fourth pulses. The first to fourth data signals correspond to the first to fourth pulses, respectively. The multiplexer may include a NAND gate that outputs a first gate signal in response to receiving the first data signal, a fourth complementary data signal that is a complementary signal of the fourth data signal, and the first pulse. A NOR gate that outputs a second gate signal in response to receiving the first data signal, the fourth complementary data signal, and a first complementary pulse complementary to the first pulse. A first transistor includes a first terminal to which a first power supply voltage is applied, a gate that receives the first gate signal, and a second terminal connected with an output terminal of the multiplexer. A second transistor that includes a first terminal connected with the output terminal of the multiplexer, a gate that receives the second gate signal, and a second terminal to which a ground voltage is applied. The first data signal may correspond to a rising edge of the first pulse, and the fourth complementary data signal may correspond to a rising edge of the fourth pulse.

BRIEF 10

The above and other objects and features of the present disclosure will become apparent by describing in detail embodiments thereof with reference to the accompanying drawings.

DETAILED DESCRIPTION

Below, embodiments of the present disclosure will be described in detail and clearly to such an extent that one skilled in the art easily carries out the present disclosure.

Hereinafter, embodiments of the present disclosure will be described in more detail with reference to accompanying drawings. In describing the present disclosure, to make the overall understanding easy, like components/elements will be marked by like reference signs/numerals in drawings, and thus, additional description will be omitted to avoid redundancy.

Figure 1:
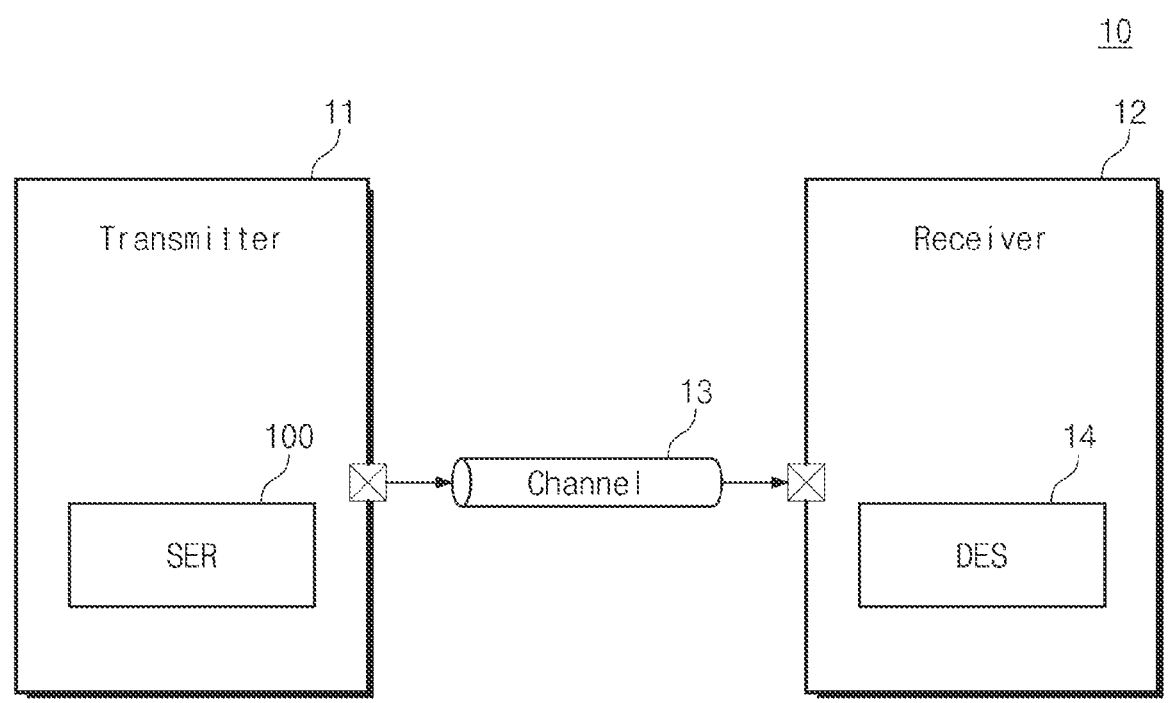
FIG. 1 illustrates a block diagram of a communication system, according to some embodiments of the present disclosure.

FIG. 1 illustrates a block diagram of a communication system 10, according to some embodiments of the present disclosure. The communication system 10 may include a transmitter 11 and a receiver 12 that communicate with each other over a channel 13. In some embodiments, the communication system 10 may be referred to as a "transceiver", a "data transmitting/receiving circuit", or a "high-speed data transmission system".

The transmitter 11 may transmit a transmit signal, which is based on data, to the receiver 12 over the channel 13. The channel 13, the number of pins of an integrated circuit in which the transmitter 11 is implemented, and the number of pins of an integrated circuit in which the receiver 12 is implemented may increase costs necessary to implement the communication system 10. To reduce costs necessary to implement the above components, the transmitter 11 may transmit a signal including serialized data bits. The transmitter 11 may include a serializer 100 for serializing data.

The channel 13 may be a path that physically or electrically connects the transmitter 11 and the receiver 12. For example, the channel 13 may be implemented by using a trace of a printed circuit board (PCB) or a coaxial cable. A skin effect, a dielectric loss, etc. of the channel 13 may weaken a high-frequency component of data that are transmitted over the channel 13. When a signal is transmitted over the channel 13, a channel loss may occur at the receiver 12. Also, impedance discontinuity (or mismatch) may occur on the channel 13 due to connectors between boards and cables and any other physical interfaces. The impedance discontinuity of the channel 13 may appear as a notch in a frequency response of the channel 13 and may cause a reflection noise at the receiver 12. Each of data bits passing through the channel 13 may hinder a subsequent bit(s) due to the channel loss or the limitation on a bandwidth, and a phenomenon in which a bit error rate increases due to the overlapping of neighboring symbols, that is, the inter symbol interference (ISI) may occur.

The receiver 12 may receive a signal from the transmitter 11 over the channel 13. The receiver 12 may include a deserializer 14 for deserializing the transmit signal. The receiver 12 may deserialize the transmit signal by using the deserializer 14.

Figure 2:
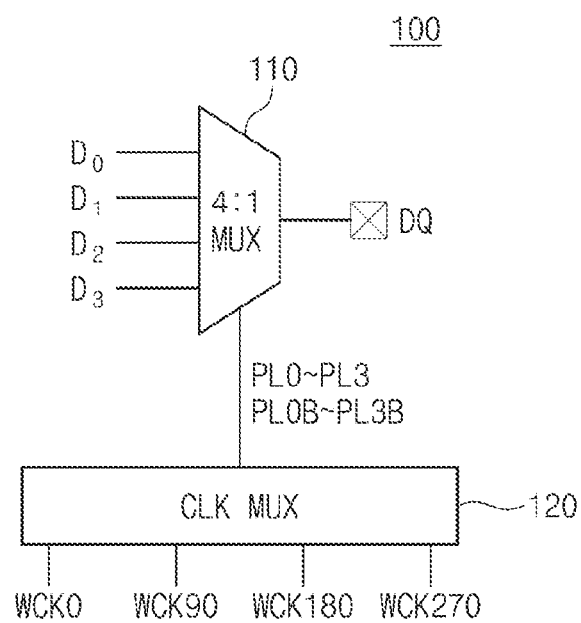
FIG. 2 illustrates a block diagram of a serializer, according to some embodiments of the present disclosure.

FIG. 2 illustrates a block diagram of the serializer 100, according to some embodiments of the present disclosure. Referring to FIGS. 1 and 2, the serializer 100 may include a multiplexer 110 and a clock multiplexer 120. The multiplexer 110 may receive data $D_0$ to $D_3$, pulses PL0 to PL3, and complementary pulses PL0B to PL3B. The multiplexer 110 may output a data signal DQ, based on the pulses PL0 to PL3, the complementary pulses PL0B to PL3B, and the data $D_0$ to $D_3$. For example, the data signal DQ output from the multiplexer 110 may correspond to a signal of sequentially serializing the data $D_0$ to $D_3$.

The clock multiplexer 120 may receive clocks WCK0, WCK90, WCK180, and WCK270. The clocks WCK0, WCK90, WCK180, and WCK270 may be generated by a processor (not illustrated) or a signal generator (not illustrated) of the transmitter 11 so as to be used in the clock multiplexer 120. The clock multiplexer 120 may generate the pulses PL0 to PL3 and the complementary pulses PL0B to PL3B, based on the clocks WCK0, WCK90, WCK180, and WCK270. The pulses PL0 to PL3 may be complementary to the complementary pulses PL0B to PL3B, respectively.

Figure 3:
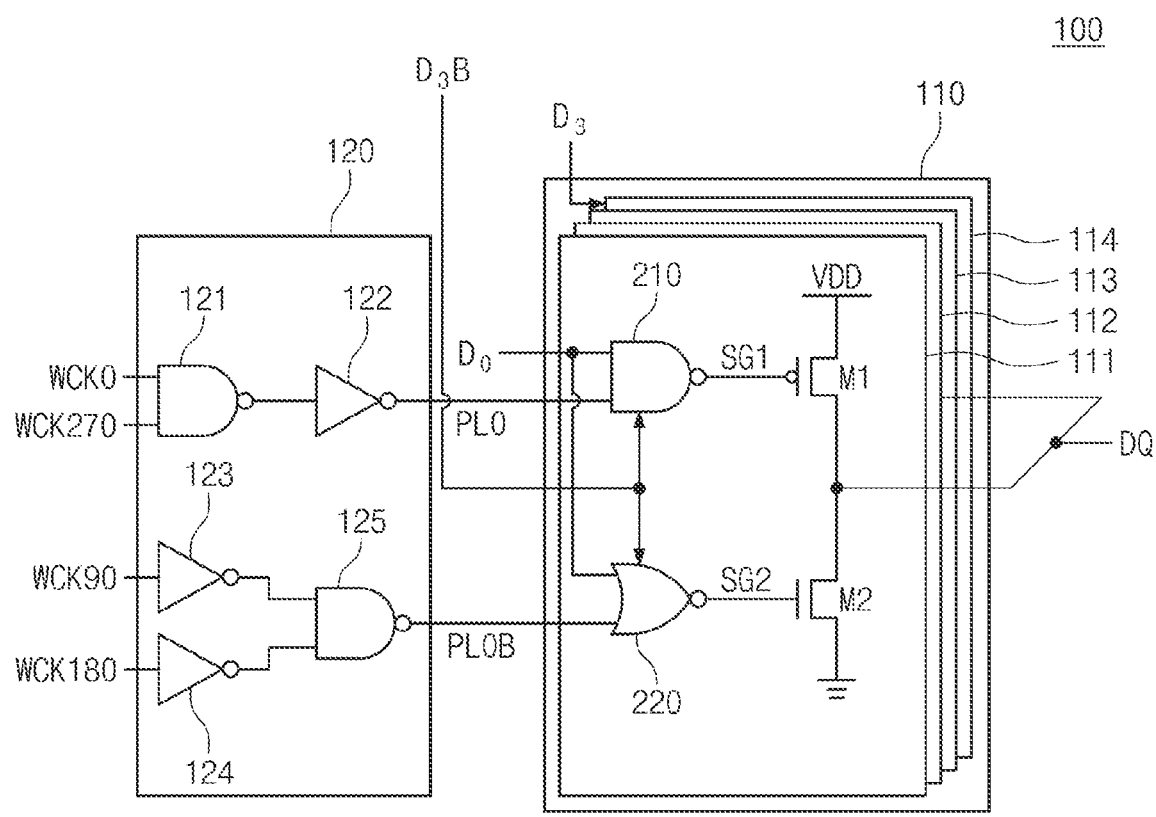
FIG. 3 illustrates a block diagram of a serializer in detail, according to some embodiments of the present disclosure.

FIG. 3 illustrates a block diagram of the serializer 100 in detail, according to some embodiments of the present disclosure. Referring to FIGS. 2 and 3, the serializer 100 may include the multiplexer 110 and the clock multiplexer 120 and the multiplexer 110 may include blocks 111 to 114 respectively corresponding to the data $D_0$ to $D_3$. For example, the block 111 may correspond to the data $D_0$. The blocks 111 to 114 may receive the pulses PL0 to PL3, the complementary pulses PL0B to PL3B, the data (or data signals) $D_0$ to $D_3$, and complementary data (e.g., in the block 111, complementary data $D_3B$) and may output the data signal DQ. The blocks 111 to 114 may sample the data $D_0$ to $D_3$ in response to the pulses PL0 to PL3 and the complementary pulses PL0B to PL3B.

Each of the blocks 111 to 114 may receive data that are complementary to data sampled at a previous pulse of the corresponding pulse (or data sampled in response to the previous pulse). For example, on a pulse number sequence, the block 111 may receive complementary data $D_3B$ that are complementary to the data $D_3$ sampled at the previous pulse PL3 of the corresponding pulse PL0 (or data sampled in response to the pulse PL3). Each of the blocks 111 to 113 may equalize an edge of the data signal DQ to be output from the multiplexer 110, based on the received complementary data. For example, each of the blocks 111 to 113 may improve a transition speed of the data signal DQ by in advance pulling down or pulling up gating signals SG1 and SG2 based on the received complementary data.

The clock multiplexer 120 may receive the clocks WCK0, WCK90, WCK180, and WCK270 and may generate the pulses PL0 to PL3 and the complementary pulses PL0B to PL3B, based on the clocks WCK0, WCK90, WCK180, and WCK270. The clock multiplexer 120 may generate the pulse PL0 and the complementary pulse PL0B by using the clock WCK0 as a reference clock. For example, the clock multiplexer 120 may include NAND gates 121 and 125 and inverters 122, 123, and 124 for the purpose of generating the pulse PL0 and the complementary pulse PL0B.

The NAND gate 121 may include input terminals for receiving the clocks WCK0 and WCK270 and an output terminal connected with an input terminal of the inverter 122. The inverter 122 may include the input terminal connected with the output terminal of the NAND gate 121 and an output terminal for outputting the pulse PL0.

The inverter 123 may include an input terminal for receiving the clock WCK90 and an output terminal connected with the NAND gate 125. The inverter 124 may include an input terminal for receiving the clock WCK180 and an output terminal connected with the NAND gate 125. The NAND gate 125 may include input terminals respectively connected with the output terminals of the inverters 123 and 124 and an output terminal for outputting the complementary pulse PL0B.

In the embodiment illustrated in FIG. 3, the clock multiplexer 120 may include the components for generating the pulse PL0 and the complementary pulse PL0B, but the configuration of the clock multiplexer 120 is not limited thereto. For example, the clock multiplexer 120 may further include components for generating the pulses PL1 to PL3 and the complementary pulses PL1B to PL3B. The components for generating the pulses PL1 to PL3 may generate the pulses PL1 to PL3 and the complementary pulses PL1B to PL3B by using the clocks WCK90, WCK180, and WCK270 as a reference clock.

For example, the clock multiplexer 120 may include a NAND gate and an inverter for the purpose of generating the pulse PL1. The NAND gate for generating the pulse PL1 may receive the clocks WCK0 and WCK90 instead of the clocks WCK0 and WCK270 and may be implemented to be similar to the NAND gate 121. The inverter for generating the pulse PL1 may include an input terminal connected with the NAND gate for generating the pulse PL1 and may be implemented to be similar to the inverter 122. The clock multiplexer 120 may include a first inverter, a second inverter, and a NAND gate for the purpose of generating the complementary pulse PL1B. The first inverter for generating the complementary pulse PL1B may receive the clock WCK180 instead of the clock WCK90 and may be implemented to be similar to the inverter 123. The second inverter for generating the complementary pulse PL1B may receive the clock WCK270 instead of the clock WCK180 and may be implemented to be similar to the inverter 124. The NAND gate for generating the complementary pulse PL1B may include input terminals connected with the first and second inverters for generating the complementary pulse PL1B and may be implemented to be similar to the NAND gate 125.

As in the above description, the clock multiplexer 120 may include a NAND gate and an inverter for the purpose of generating the pulse PL2. For example, the NAND gate for generating the pulse PL2 may receive the clocks WCK180 and WCK90 instead of the clocks WCK0 and WCK270 and may be implemented to be similar to the NAND gate 121. The inverter for generating the pulse PL2 may include an input terminal connected with the NAND gate for generating the pulse PL2 and may be implemented to be similar to the inverter 122. The clock multiplexer 120 may include a first inverter, a second inverter, and a NAND gate for the purpose of generating the complementary pulse PL2B. The first inverter for generating the complementary pulse PL2B may receive the clock WCK270 instead of the clock WCK90 and may be implemented to be similar to the inverter 123. The second inverter for generating the complementary pulse PL2B may receive the clock WCK0 instead of the clock WCK180 and may be implemented to be similar to the inverter 124. The NAND gate for generating the complementary pulse PL2B may include input terminals connected with the first and second inverters for generating the complementary pulse PL2B and may be implemented to be similar to the NAND gate 125.

As in the above description, the clock multiplexer 120 may include a NAND gate and an inverter for the purpose of generating the pulse PL3. For example, the NAND gate for generating the pulse PL3 may receive the clocks WCK180 and WCK270 instead of the clocks WCK0 and WCK270 and may be implemented to be similar to the NAND gate 121. The inverter for generating the pulse PL3 may include an input terminal connected with the NAND gate for generating the pulse PL3 and may be implemented to be similar to the inverter 122. The clock multiplexer 120 may include a first inverter, a second inverter, and a NAND gate for the purpose of generating the complementary pulse PL3B. The first inverter for generating the complementary pulse PL3B may receive the clock WCK0 instead of the clock WCK90 and may be implemented to be similar to the inverter 123. The second inverter for generating the complementary pulse PL3B may receive the clock WCK90 instead of the clock WCK180 and may be implemented to be similar to the inverter 124. The NAND gate for generating the complementary pulse PL3B may include input terminals connected with the first and second inverters for generating the complementary pulse PL3B and may be implemented to be similar to the NAND gate 125.

The block 111 may include a NAND gate 210, a NOR gate 220, and transistors M1 and M2. The NAND gate 210 may include input terminals of respectively receiving the data $D_0$ and the pulse PL0 and an output terminal connected with a gate of the transistor M1. The NAND gate 210 may further receive the complementary data $D_3B$. The complementary data $D_3B$ may be complementary to the data $D_3$ sampled (or to be sampled) in response to the pulse PL3 being a previous pulse toggling immediately before the pulse PL0. The NAND gate 210 may output the gate signal SG1 to the transistor M1, based on the data $D_0$, the pulse PL0, and the complementary data $D_3B$.

The NOR gate 220 may include input terminals of respectively receiving the data $D_0$ and the complementary pulse PL0B and an output terminal connected with a gate of the transistor M2. The NOR gate 220 may further receive the complementary data $D_3B$. The NOR gate 220 may output the gate signal SG2 to the transistor M2, based on the data $D_0$, the complementary pulse PL0B, and the complementary data $D_3B$.

The transistor M1 may include a first terminal to which a voltage VDD is applied, the gate connected with the output terminal of the NAND gate 210, and a second terminal connected with a first terminal of the transistor M2. The transistor M1 may be turned on or turned off in response to the gate signal SG1. The transistor M2 may include the first terminal connected with the second terminal of the transistor M1, the gate connected with the output terminal of the NOR gate 220, and a second terminal to which a ground voltage is applied. The transistor M2 may be turned on or turned off in response to the gate signal SG2. The second terminal of the transistor M1 and the first terminal of the transistor M2 may be connected with the output terminal of the multiplexer 110, from which the data signal DQ is output.

Configuration and operations of the blocks 112, 113, and 114 may be similar to those of the block 111. Each of the blocks 112, 113, and 114 may be implemented to correspond to relevant data. For example, the block 112 corresponding to the data $D_1$ may include a NAND gate that receives the data $D_1$, the pulse PL1, and the complementary data $D_0B$ instead of the data $D_0$, the pulse PL0, and the complementary data $D_3B$ and is implemented to be similar to the NAND gate 210, and a NOR gate that receives the data $D_1$, the complementary pulse PL1B, and the complementary data $D_0B$ instead of the data $D_0$, the complementary pulse PL0B, and the complementary data $D_3B$ and is implemented to be similar to the NOR gate 220. As in the above description, the block 113 may be implemented to correspond to the data $D_2$, the pulse PL2, and the complementary data $D_1B$, and the block 114 may be implemented to correspond to the data $D_3$, the pulse PL3, and the complementary data $D_2B$.

Figure 4:
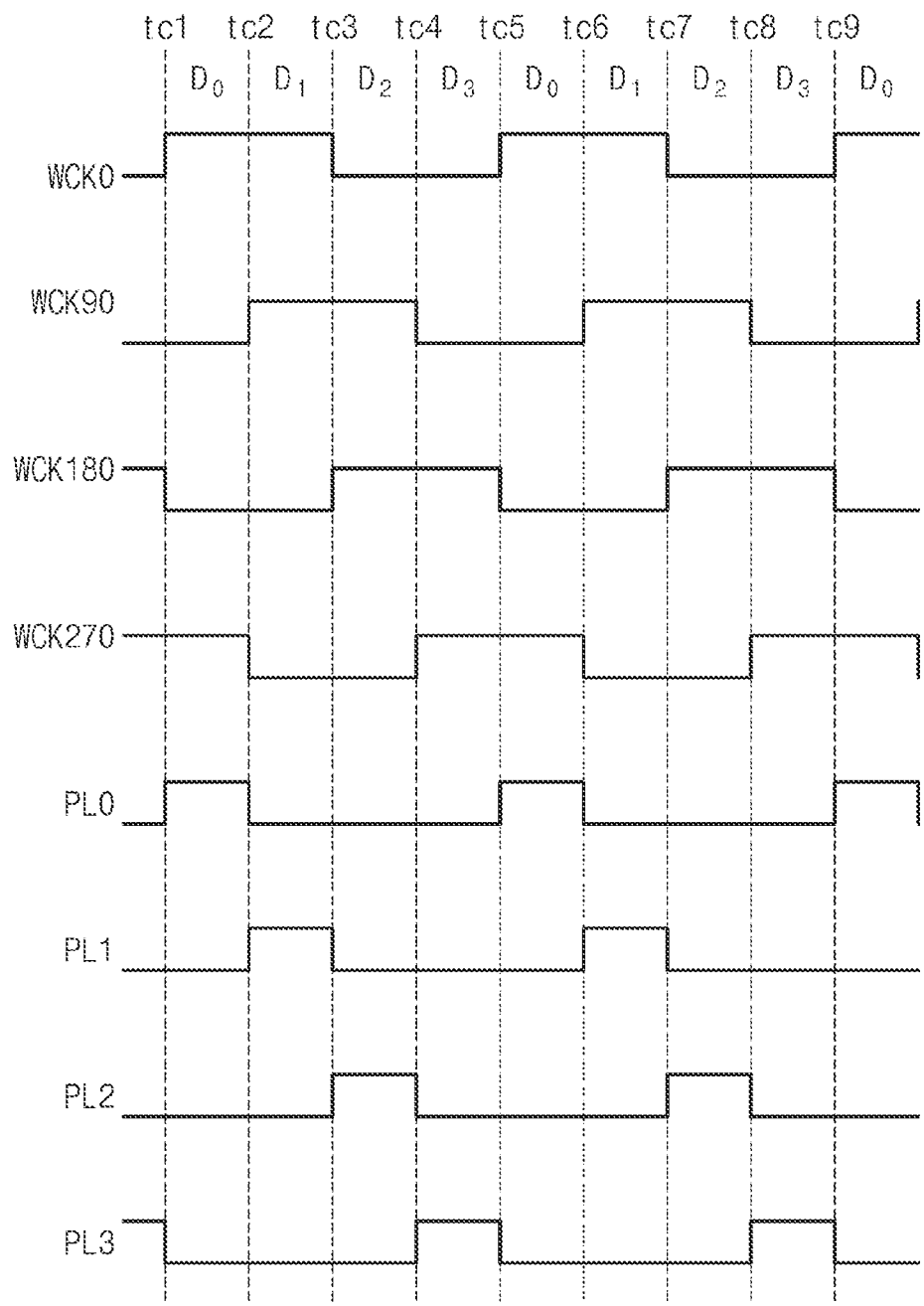
FIG. 4 illustrates a timing diagram of clocks and pulses used in a serializer, according to some embodiments of the present disclosure.

FIG. 4 illustrates a timing diagram of the clocks WCK0, WCK90, WCK180, and WCK270 and the pulses PL0, PL1, PL2, and PL3 used in the serializer 100, according to some embodiments of the present disclosure. Referring to FIGS. 2 to 4, the clocks WCK90, WCK180, and WCK270 input to the clock multiplexer 120 may be signals having a phase difference with the clock WCK0 as much as a multiple of 90 degrees. For example, the clock WCK0 and the clock WCK90 may have a phase difference of 90 degrees. The clock WCK0 and the clock WCK180 may have a phase difference of 180 degrees. The clock WCK0 and the clock WCK270 may have a phase difference of 270 degrees.

The data $D_0$, $D_1$, $D_2$, and $D_3$ may be input to the multiplexer 110 in synchronization with the clocks WCK0, WCK90, WCK180, and WCK270. For example, the data $D_0$ may be input to the multiplexer 110 in synchronization with the rising edge of the clock WCK0 (e.g., points in time tc1, tc5, and tc9). The data $D_1$ may be input to the multiplexer 110 in synchronization with the rising edge of the clock WCK90 (e.g., points in time tc2 and tc6). The data $D_2$ may be input to the multiplexer 110 in synchronization with the rising edge of the clock WCK180 (e.g., points in time tc3 and tc7). The data $D_3$ may be input to the multiplexer 110 in synchronization with the rising edge of the clock WCK270 (e.g., points in time tc4 and tc8).

The pulses PL0, PL1, PL2, and PL3 may toggle in response to the rising edges of the clocks WCK0, WCK90, WCK180, and WCK270, respectively. For example, the pulse PL0 may toggle in response to the rising edge of the clock WCK0 (e.g., points in times tc1, tc5, and tc9). The pulse PL1 may toggle in response to the rising edge of the clock WCK90 (e.g., points in times tc2 and tc6). The pulse PL2 may toggle in response to the rising edge of the clock WCK180 (e.g., points in times tc3 and tc7). The pulse PL3 may toggle in response to the rising edge of the clock WCK270 (e.g., points in times tc4 and tc8). The clock multiplexer 120 may provide the pulses PL0, PL1, PL2, and PL3 to the multiplexer 110, and the multiplexer 110 may sample the data $D_0$, $D_1$, $D_2$, and $D_3$ in response to the rising edges of the pulses PL0, PL1, PL2, and PL3, respectively.

In the present disclosure, a previous pulse of an arbitrary pulse may indicate a pulse that toggles immediately before the arbitrary pulse on a pulse number sequence. For example, a previous pulse of the pulse PL0 may be the pulse PL3; a previous pulse of the pulse PL1 may be the pulse PL0; a previous pulse of the pulse PL2 may be the pulse PL1; a previous pulse of the pulse PL3 may be the pulse PL2.

In the present disclosure, data input prior to arbitrary data may indicate data that are input immediately before the arbitrary data on a pulse number sequence or data input prior to arbitrary data may indicate data that are input in response to a previous pulse of a pulse corresponding to the arbitrary data. For example, data input to the multiplexer 110 prior to the data $D_1$ input at the point in time tc2 may be the data $D_0$ input at the point in time tc1. Data input to the multiplexer 110 prior to the data $D_2$ input at the point in time tc3 may be the data $D_1$ input at the point in time tc2. Data input to the multiplexer 110 prior to the data $D_3$ input at the point in time tc4 may be the data $D_2$ input at the point in time tc3. Data input to the multiplexer 110 prior to the data $D_0$ input at the point in time tc5 may be the data $D_3$ input at the point in time tc4.

Figure 5:
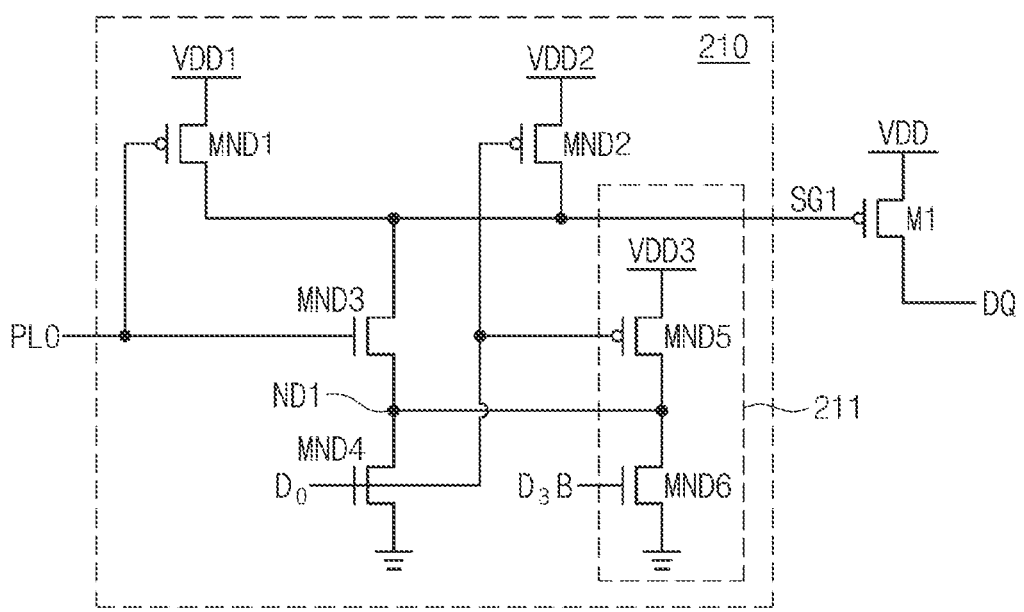
FIG. 5 illustrates a circuit diagram of a NAND gate of a multiplexer, according to some embodiments of the present disclosure.

FIG. 5 illustrates a circuit diagram of the NAND gate 210 of the multiplexer 110, according to some embodiments of the present disclosure. Referring to FIGS. 2 to 5, the NAND gate 210 included in the block 111 may include transistors MND1, MND2, MND3, and MND4 and a circuit 211. The transistors MND1 and MND2 may be implemented as PMOS transistors, and the transistors MND3 and MND4 may be implemented as NMOS transistors.

The transistor MND1 may include a first terminal to which a voltage VDD1 is applied, a gate to which the pulse PL0 is applied, and a second terminal connected with the gate of the transistor M1. The transistor MND2 may include a first terminal to which a voltage VDD2 is applied, a gate to which the data $D_0$ are applied, and a second terminal connected with the gate of the transistor M1. The transistor MND3 may include a first terminal connected with the gate of the transistor M1, a gate to which the pulse PL0 is applied, and a second terminal connected with a node ND1. The transistor MND4 may include a first terminal connected with the node ND1, a gate to which the data $D_0$ are applied, and a second terminal to which the ground voltage is applied.

The circuit 211 may include transistors MND5 and MND6. The transistor MND5 may include a first terminal to which a voltage VDD3 is applied, a gate to which the data $D_0$ are applied, and a second terminal connected with the node ND1. The transistor MND6 may include a first terminal connected with the node ND1, a gate to which the data $D_3B$ are applied, and a second terminal to which the ground voltage is applied. The transistor MND5 may be implemented as a PMOS transistor, and the transistor MND6 may be implemented as an NMOS transistor. When the data $D_3$ are sampled in the block 114 in response to the pulse PL3 of the rising edge (or when the data $D_3$ are input to the block 114), the complementary data $D_3B$ may be input to the block 111.

The circuit 211 may pull down a level of a voltage of the node ND1 as much as a given level (e.g., to the ground voltage or a voltage close to the ground voltage) before the rising edge of the pulse PL0, by using the data $D_3$ (or the data $D_3B$ complementary to the data $D_3$) corresponding to the pulse PL3 being the previous pulse of the pulse PL0. As such, a decrease of time may be achieved for decreasing a level of the gate signal SG1 to be lower than a threshold voltage of the transistor M1 in response to the pulse PL0 of the rising edge to be applied next and the data $D_0$ corresponding to the pulse PL0. This may mean that a transition speed of the data signal DQ becomes fast. As a result, an intersymbol interference (ISI) due to the rising edge of data input from the serializer 100 may decrease.

Figure 6A:
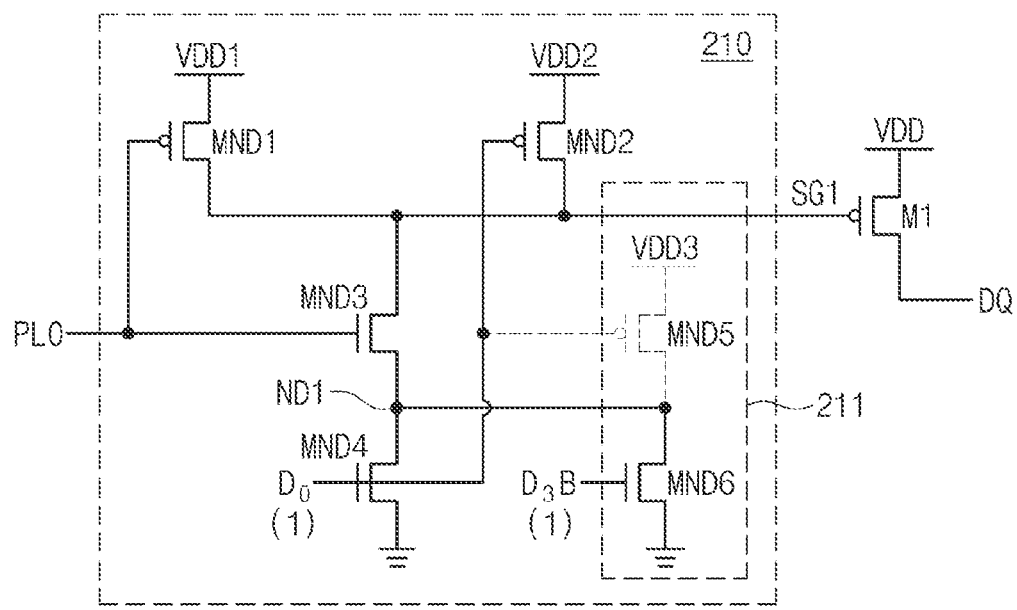
FIGS. 6A and 6B illustrate operations of a NAND gate of a multiplexer, according to some embodiments of the present disclosure.
Figure 6B:
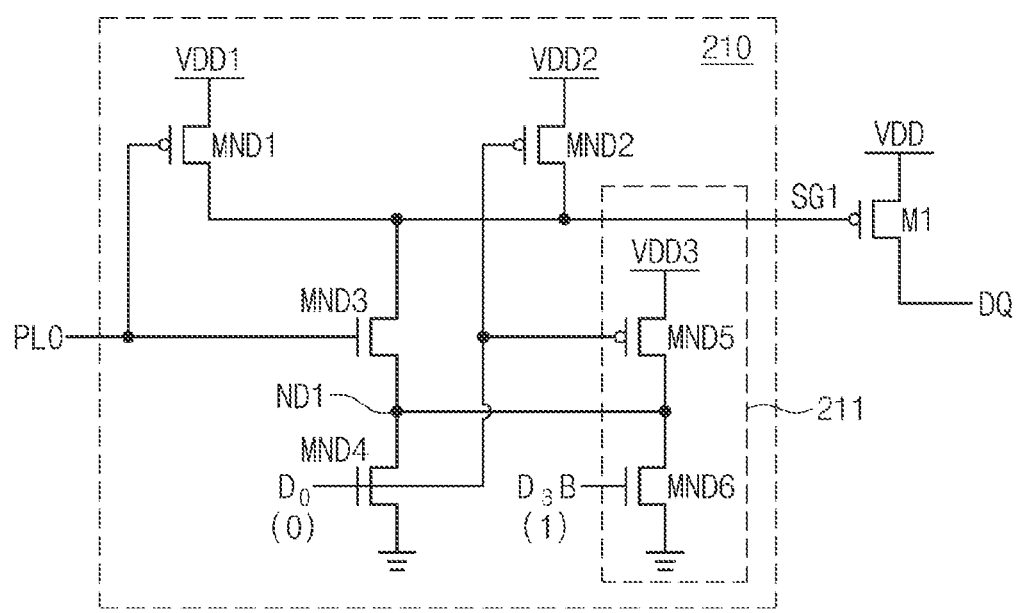

FIGS. 6A and 6B illustrate operations of the NAND gate 210 of the multiplexer 110, according to some embodiments of the present disclosure. Referring to FIGS. 2 to 5, 6A, and 6B, the NAND gate 210 may output the gate signal SG1 corresponding to the pulse PL0 and the data $D_0$, based on complementary data (i.e., the data $D_3B$) of the data $D_3$ corresponding to the previous pulse PL3 of the pulse PL0.

In the embodiment illustrated in FIG. 6A, data that are input to the serializer 100 may transition at the rising edge of the pulse PL0. For example, when the data $D_3$ input in response to the rising edge of the previous pulse PL3 correspond to logic low, the data $D_0$ input in response to the rising edge of the pulse PL0 may correspond to logic high.

The data $D_3B$ (i.e., "1") corresponding to logic high may be in advance applied to the gate of the transistor MND6 in response to the previous pulse PL3 of the pulse PL0. The transistor MND6 may be turned on in response to the data $D_3B$ corresponding to logic high. A voltage of the node ND1 may be pulled down in response to the transistor MND6 being turned on. In other words, the NAND gate 210 may be understood as being turned on (activated) partially in advance by the previous data $D_3$.

Afterwards, the pulse PL0 (or the pulse PL0 of the rising edge) corresponding to logic high may be applied to the transistors MND1 and MND3 and the data $D_0$ (i.e., "1") corresponding to logic high may be applied to the gates of the transistors MND2, MND4, and MND5. As such, the transistors MND1, MND2, and MND5 may be turned off, and the transistors MND3 and MND4 may be turned on. As a result, a level of the gate signal SG1 applied to the gate of the transistor M1 may fall more quickly due to the voltage of the node ND1 being previously pulled down (e.g., faster than when the NAND gate 210 is not activated in advance).

The level of the gate signal SG1 applied to the gate of the transistor M1 may fall more quickly due to the data $D_3B$ applied to the transistor MND6, and thus, a time taken to turn on the transistor M1 in response to the data $D_0$ may decrease. As a result, a transition speed of the data signal DQ that is output from the serializer 100 may be improved. In other words, a speed at which a signal output from the serializer 100 transitions in response to a transition of data input to the serializer 100 may be improved through the circuit 211. The intersymbol interference due to the rising edge of the input data may be improved.

In the embodiment illustrated in FIG. 6B, data that are input to the serializer 100 may not transition at the rising edge of the pulse PL0. For example, when the data $D_3$ input in response to the rising edge of the previous pulse PL3 correspond to logic low, the data $D_0$ input in response to the rising edge of the pulse PL0 may correspond to logic low.

The data $D_3B$ (i.e., "1") corresponding to logic high may be in advance applied to the gate of the transistor MND6 in response to the previous pulse PL3 of the pulse PL0. The transistor MND6 may be turned on in response to the data $D_3B$ corresponding to logic high.

Afterwards, the pulse PL0 (or the pulse PL0 of the rising edge) corresponding to logic high may be applied to the transistors MND1 and MND3, and the data $D_0$ (i.e., "0") corresponding to logic low may be applied to the gates of the transistors MND2, MND4, and MND5. As such, the transistors MND1 and MND4 may be turned off, and the transistors MND2, MND3, and MND5 may be turned on. A voltage of the node ND1 may rise as much as a given level due to the turned-on transistor MND5. As the voltage of the node ND1 increases, the transistor MND3 may be turned off, or a level of a current flowing to the node ND1 through the transistor MND3 may decrease. As such, a level of the gate signal SG1 output from the NAND gate 210 may be prevented from being lower than the threshold voltage of the transistor M1. In other words, an abnormal operation of the NAND gate 210 due to the complementary data $D_3B$ may be prevented by the transistor MND5, and the occurrence of a glitch may be prevented.

Figure 7:
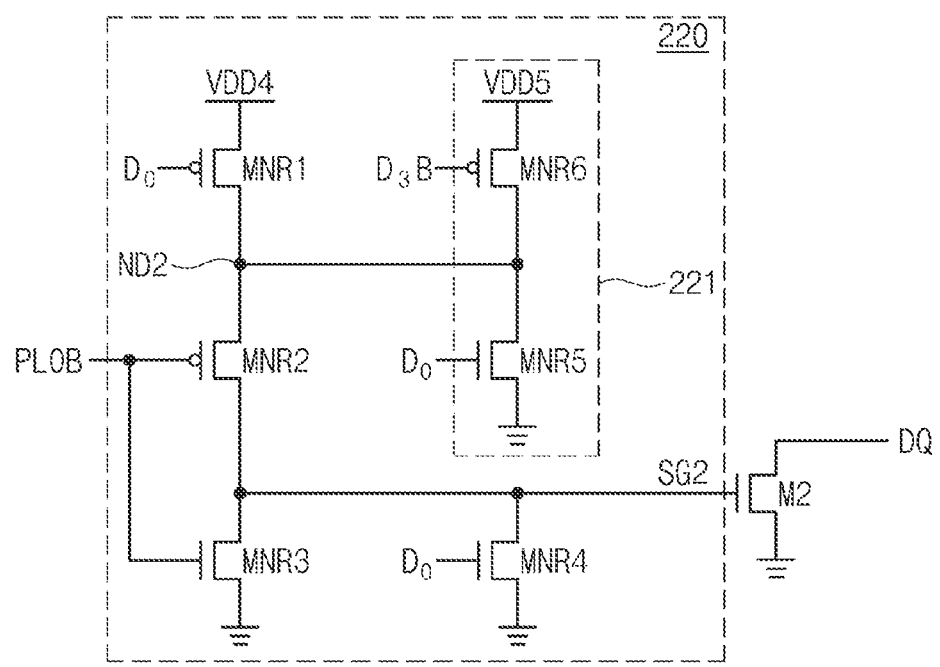
FIG. 7 illustrates a circuit diagram of a NOR gate of a multiplexer, according to some embodiments of the present disclosure.

FIG. 7 illustrates a circuit diagram of the NOR gate 220 of the multiplexer 110, according to some embodiments of the present disclosure. Referring to FIGS. 2 to 4 and 7, the NOR gate 220 included in the block 111 may include transistors MNR1, MNR2, MNR3, and MNR4 and a circuit 221. The transistors MNR1 and MNR2 may be implemented as PMOS transistors, and the transistors MNR3 and MNR4 may be implemented as NMOS transistors.

The transistor MNR1 may include a first terminal to which a voltage VDD4 is applied, a gate to which the data $D_0$ are applied, and a second terminal connected with a node ND2. The transistor MNR2 may include a first terminal connected with the node ND2, a gate to which the complementary pulse PL0B is applied, and a second terminal connected with the gate of the transistor M2. The transistor MNR3 may include a first terminal connected with the gate of the transistor M2, a gate to which the complementary pulse PL0B is applied, and a second terminal to which the ground voltage is applied. The transistor MNR4 may include a first terminal connected with the gate of the transistor M2, a gate to which the data $D_0$ are applied, and a second terminal to which the ground voltage is applied.

The circuit 221 may include transistors MNR5 and MNR6. The transistor MNR5 may include a first terminal connected with the node ND2, a gate to which the data $D_0$ are applied, and a second terminal to which the ground voltage is applied. The transistor MNR6 may include a first terminal to which a voltage VDD5 is applied, a gate to which the complementary data $D_3B$ are applied, and a second terminal connected with the node ND2. The transistor MNR5 may be implemented as an NMOS transistor, and the transistor MNR6 may be implemented as a PMOS transistor. When the data $D_3$ are sampled in the block 114 in response to the pulse PL3 of the rising edge (or when the data $D_3$ are input to the block 114), the complementary data $D_3B$ may be input to the block 111.

The circuit 221 may pull up a level of a voltage of the node ND2 as much as a given level (e.g., to the voltage VDD5 or a voltage close to the voltage VDD5) before the falling edge of the pulse PL0B (or before the rising edge of the pulse PL0), by using the data $D_3$ (or the data $D_3B$ complementary to the data $D_3$) corresponding to the pulse PL3 being the previous pulse of the pulse PL0. As such, a time may decrease for increasing a level of the gate signal SG2 to be higher than the threshold voltage of the transistor M2 in response to the falling edge of the pulse PL0B and the data $D_0$ corresponding to the pulse PL0B. This may mean that a transition speed of the data signal DQ becomes fast. As a result, an intersymbol interference (ISI) according to the falling edge of data input from the serializer 100 may decrease.

Figure 8A:
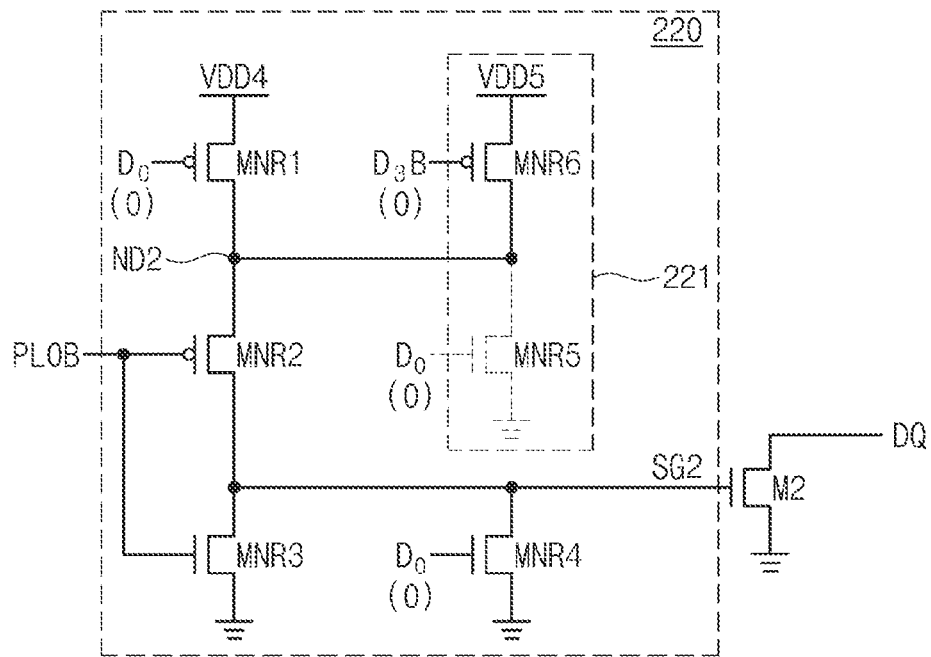
FIGS. 8A and 8B illustrate operations of a NOR gate of a multiplexer, according to some embodiments of the present disclosure.
Figure 8B:
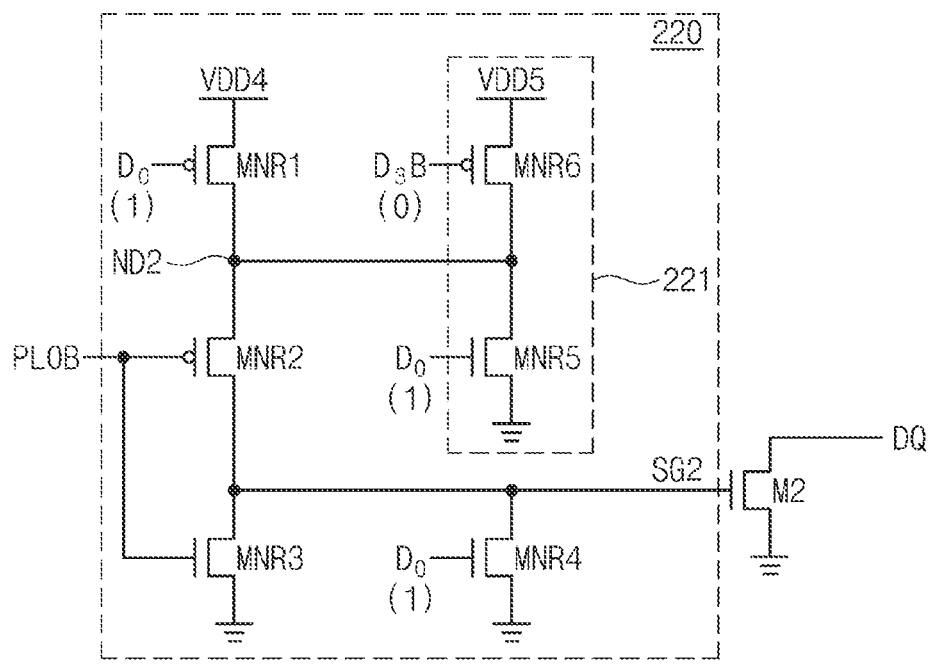

FIGS. 8A and 8B illustrate an operation of the NOR gate 220 of the multiplexer 110, according to some embodiments of the present disclosure. Referring to FIGS. 2 to 4, 8A, and 8B, the NOR gate 220 may output the gate signal SG2 corresponding to the complementary pulse PL0B and the signal $D_0$, based on complementary data (i.e., the data $D_3B$) of the data $D_3$ corresponding to the previous pulse PL3 of the pulse PL0.

In the embodiment illustrated in FIG. 8A, data that are input to the serializer 100 may transition at the falling edge of the complementary pulse PL0B. For example, when the data $D_3$ input in response to the rising edge of the previous pulse PL3 correspond to logic high, the data $D_0$ input in response to the falling edge of the complementary pulse PL0B may correspond to logic low.

The data $D_3B$ (i.e., "0") corresponding to logic low may be in advance applied to the gate of the transistor MNR6 in response to the previous complementary pulse PL3B of the complementary pulse PL0B. The transistor MNR6 may be turned on in response to the data $D_3B$ corresponding to logic low. A voltage of the node ND2 may be pulled up in response to the transistor MNR6 being turned on. In other words, the NOR gate 220 may be understood as being turned on (activated) partially in advance by the previous data $D_3$.

Afterwards, the complementary pulse PL0B (or the complementary pulse PL0B of the falling edge) corresponding to logic low may be applied to the transistors MNR2 and MNR3, and the data $D_0$ (i.e., "0") corresponding to logic low may be applied to the gates of the transistors MNR1, MNR4, and MNR5. As such, the transistors MNR1 and MNR2 may be turned on and the transistors MNR3, MNR4, and MNR5 may be turned off. As a result, a level of the gate signal SG2 applied to the gate of the transistor M2 may rise more quickly due to the voltage of the node ND2 previously pulled up (e.g., faster than when the NOR gate 220 is not activated in advance).

The level of the gate signal SG2 applied to the gate of the transistor M2 may rise more quickly due to the data $D_3B$ applied to the transistor MNR6, and thus, a time taken to turn on the transistor M2 in response to the data $D_0$ may decrease. As a result, a transition speed of the data signal DQ that is output from the serializer 100 may be improved. In other words, a speed at which a signal output from the serializer 100 transitions in response to a transition of data input to the serializer 100 may be improved through the circuit 221. Accordingly, the intersymbol interference due to the falling edge of the input data may be improved.

In the embodiment illustrated in FIG. 8B, data that are input to the serializer 100 may not transition at the falling edge of the complementary pulse PL0B. For example, when the data $D_3$ input in response to the rising edge of the previous pulse PL3 correspond to logic high, the data $D_0$ input in response to the falling edge of the complementary pulse PL0B may correspond to logic high.

The data $D_3B$ (i.e., "0") corresponding to logic low may be in advance applied to the gate of the transistor MNR6 in response to the previous complementary pulse PL3B of the complementary pulse PL0B. The transistor MNR6 may be turned on in response to the data $D_3B$ corresponding to logic low.

Afterwards, the complementary pulse PL0B (or the complementary pulse PL0B of the falling edge) corresponding to logic low may be applied to the transistors MNR2 and MNR3, and the data $D_0$ (i.e., "1") corresponding to logic high may be applied to the gates of the transistors MNR1, MNR4, and MNR5. As such, the transistors MNR1 and MNR3 may be turned off and the transistors MNR2, MNR4, and MNR5 may be turned on. A voltage of the node ND2 may fall as much as a given level due to the turned-on transistor MNR5. As the voltage of the node ND2 decreases, the transistor MNR1 may be turned on or a level of a current flowing to the node ND2 through the transistor MNR1 may increase. As such, a level of the gate signal SG2 output from the NOR gate 220 may be prevented from being higher than the threshold voltage of the transistor M2. In other words, an abnormal operation of the NOR gate 220 due to the complementary data $D_3B$ may be prevented by the transistor MNR5, and the occurrence of a glitch may be prevented.

Figure 9:
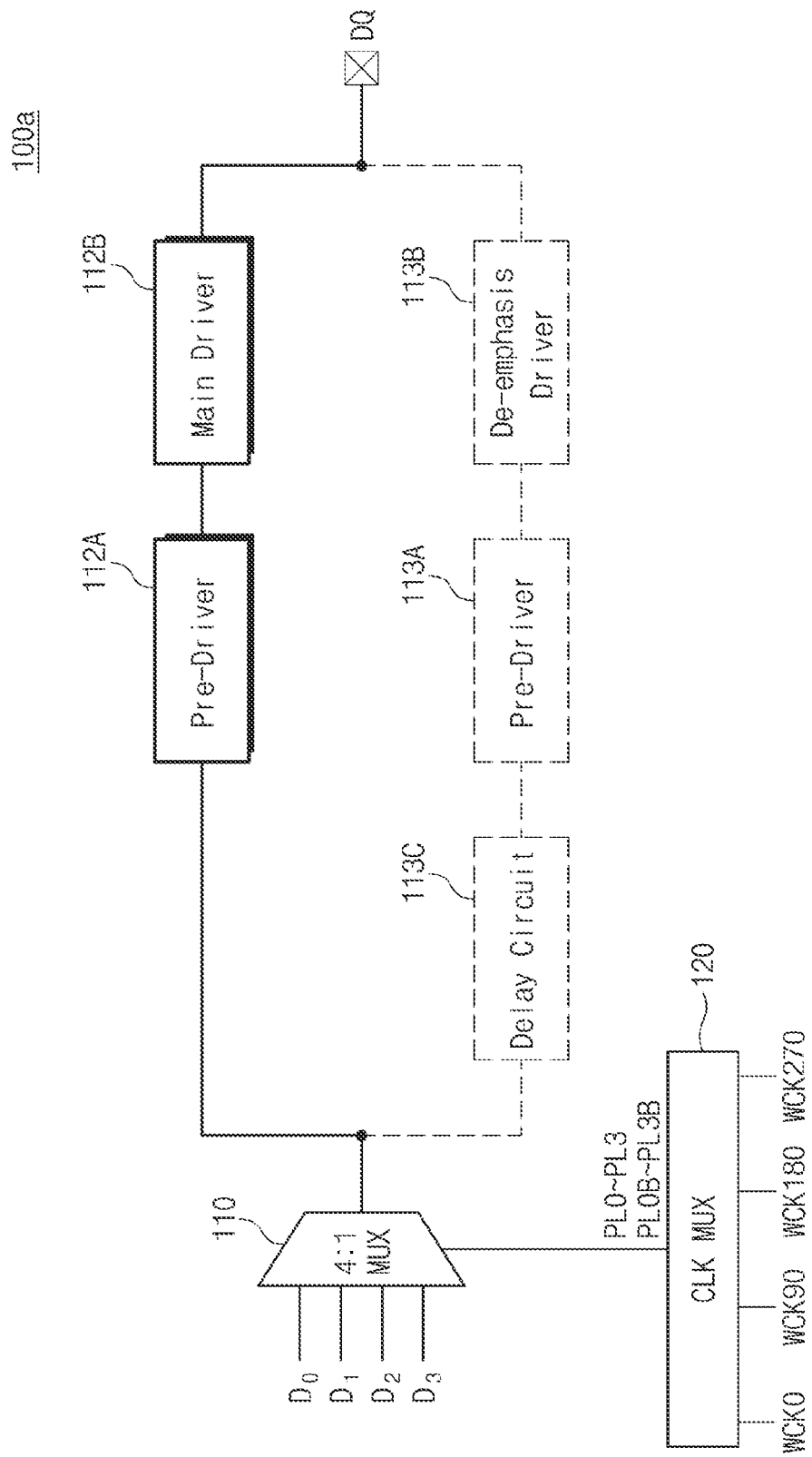
FIG. 9 illustrates a block diagram of a serializer, according to some embodiments of the present disclosure.

FIG. 9 illustrates a block diagram of a serializer 100a, according to some embodiments of the present disclosure. Referring to FIGS. 1, 2, and 9, the serializer 100a may further include pre-drivers 112A and 113A, a main driver 112B, a de-emphasis driver 113B, and a delay circuit 113C, in addition to the multiplexer 110 and the clock multiplexer 120 of FIG. 2.

The pre-driver 112A may be connected with the output terminal of the multiplexer 110. The pre-driver 112A may pre-process a signal output from the multiplexer 110 and may transfer the pre-processed signal to the main driver 112B. The main driver 112B may transfer the signal to the output terminal of the serializer 100a, based on the signal transferred from the multiplexer 110 through the pre-driver 112A.

The delay circuit 113C may be connected with the output terminal of the multiplexer 110. The delay circuit 113C may delay the signal output from the multiplexer 110 as much as a unit time. For example, the delay circuit 113C may delay the signal output from the multiplexer 110 as much as a time during which the rising edge of the pulse PL0 is maintained (or as much as a duty of the pulse PL0). The pre-driver 113A may pre-process a signal output from the delay circuit 113C and may transfer the pre-processed signal to the de-emphasis driver 113B. A configuration and an operation of the pre-driver 113A may be similar to those of the pre-driver 112A. The de-emphasis driver 113B may attenuate a magnitude of the signal output from the pre-driver 113A. For example, the de-emphasis driver 113B may decrease the magnitude of the signal output from the pre-driver 113A at a given ratio. As such a swing width of the voltage output from the pre-driver 113A may decrease. The de-emphasis driver 113B may transfer the attenuated (or amplified) signal to the output terminal of the serializer 100a.

The data signal DQ output from the output terminal of the serializer 100a may correspond to a sum of the signal output from the main driver 112B and the signal output from the de-emphasis driver 113B. A magnitude of an edge of the data signal DQ, which corresponds to an edge of the input data of the serializer 100a, may be increased by the signal output from the de-emphasis driver 113B, and thus, the intersymbol interference due to the edge may be prevented. At the same time, a power supply noise induced jitter (PSIJ) introduced into the data signal DQ may increase due to the attenuation operation of the de-emphasis driver 113B. Also, as the signal output from the multiplexer 110 further passes through the delay circuit 113C, the pre-driver 113A, and the de-emphasis driver 113B, an operating speed of the serializer 100a may become slower. As the de-emphasis driver 113B operates in response to the clocks WCK0 to WCK270, the de-emphasis driver 113B may be affected by frequencies of the clocks WCK0 to WCK270 and may cause an increase in the loading of the clocks WCK0 to WCK270.

In some embodiments, as the serializer 100a includes the multiplexer 110 described with reference to FIGS. 3 to 7B, the intersymbol interference may be prevented, and an operation of the de-emphasis driver 113B may not be required. As such, unlike the serializer 100a of FIG. 9, the serializer 100 of FIG. 2 may not include the delay circuit 113C, the pre-driver 113A, and the de-emphasis driver 113B. As a result, the serializer 100 of FIG. 2 may have a smaller jitter than the serializer 100a of FIG. 9 and may also operate more quickly than the serializer 100 of FIG. 9. Also, because the multiplexer 110 does not operate in response to the clocks WCK0 to WCK270, the influence of the clocks WCK0 to WCK270 on the output signal of the multiplexer 110 may decrease.

Figure 10:
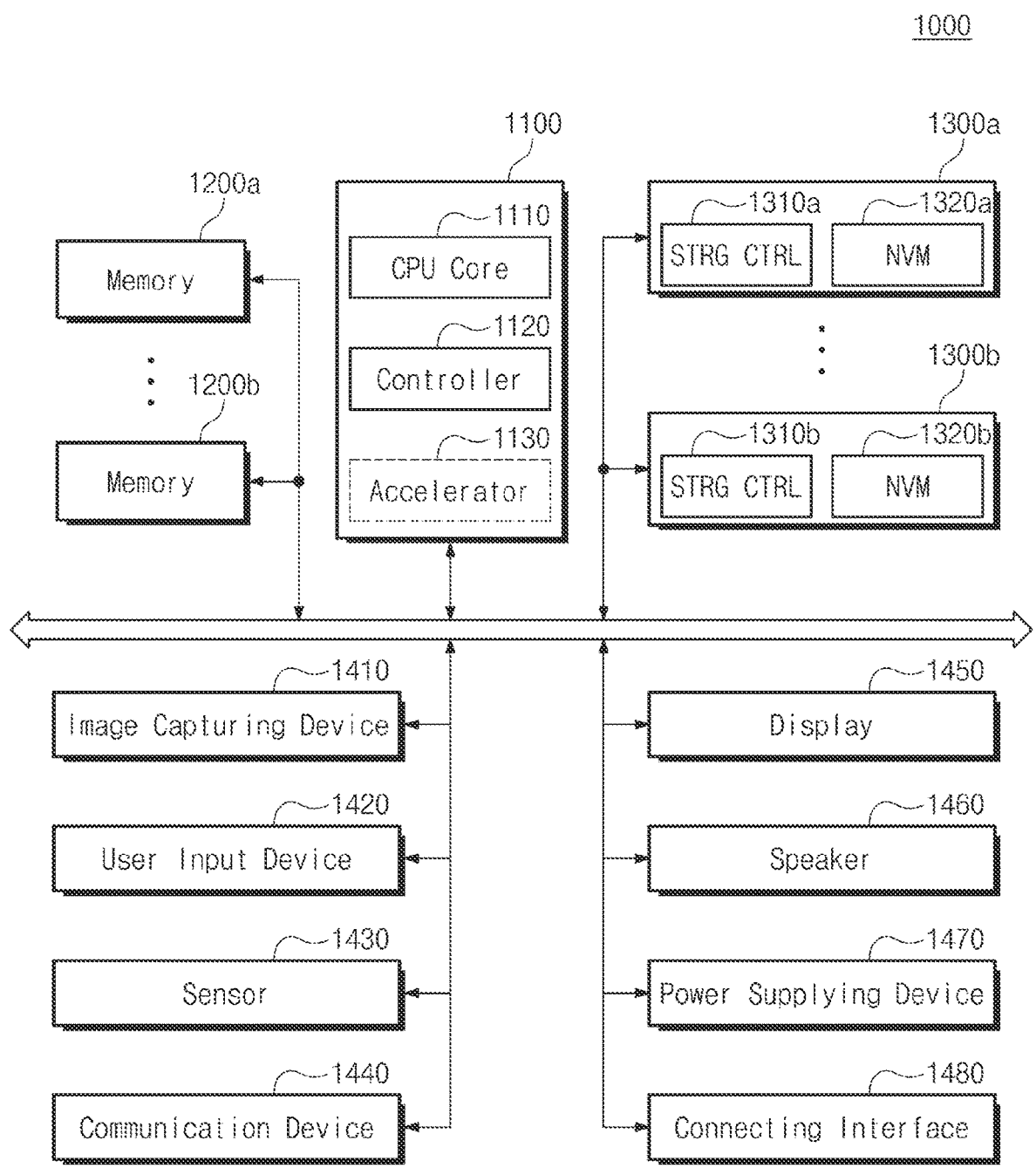
FIG. 10 illustrates a block diagram of a system, according to some embodiments of the present disclosure.

FIG. 10 is a diagram of a system 1000 to which a storage device is applied, according to an embodiment. The system 1000 of FIG. 10 basically may be a mobile system, such as a portable communication terminal (e.g., a mobile phone), a smartphone, a tablet personal computer (PC), a wearable device, a healthcare device, or an Internet of things (IOT) device. However, the system 1000 of FIG. 10 is not necessarily limited to the mobile system and may be a PC, a laptop computer, a server, a media player, or an automotive device (e.g., a navigation device).

Referring to FIG. 10, the system 1000 may include a main processor 1100, memories (e.g., 1200a and 1200b), and storage devices (e.g., 1300a and 1300b). In addition, the system 1000 may include at least one of an image capturing device 1410, a user input device 1420, a sensor 1430, a communication device 1440, a display 1450, a speaker 1460, a power supplying device 1470, and a connecting interface 1480.

In some embodiments, at least one of the components of the system 1000 may include the transmitter 11 of FIG. 1 for the purpose of communicating with any other component of the system 1000. For example, at least one (e.g., the main processor 1100, the memories 1200a and 1200b, the storage devices 1300a and 1300b, the communication device 1440, or the connecting interface 1480) of the components of the system 1000 may include the transmitter 11 including the serializer 100 of FIG. 2 for serializing a signal generated by the at least one component.

The main processor 1100 may control all operations of the system 1000, more specifically, operations of other components included in the system 1000. The main processor 1100 may be implemented as a general-purpose processor, a dedicated processor, or an application processor.

The main processor 1100 may include at least one CPU core 1110 and further include a controller 1120 configured to control the memories 1200a and 1200b and/or the storage devices 1300a and 1300b. In some embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU), and/or a data processing unit (DPU) and may be implemented with a separate chip physically independent of any other component of the main processor 1100.

The memories 1200a and 1200b may be used as main memory devices of the system 1000. Although each of the memories 1200a and 1200b may include a volatile memory, such as static random access memory (SRAM) and/or dynamic RAM (DRAM), each of the memories 1200a and 1200b may include non-volatile memory, such as a flash memory, phase-change RAM (PRAM) and/or resistive RAM (RRAM). The memories 1200a and 1200b may be implemented in the same package as the main processor 1100.

The storage devices 1300a and 1300b may serve as non-volatile storage devices configured to store data regardless of whether power is supplied thereto and have larger storage capacity than the memories 1200a and 1200b. The storage devices 1300a and 1300b may respectively include storage controllers (STRG CTRL) 1310a and 1310b and NVMs (Non-Volatile Memories) 1320a and 1320b configured to store data via the control of the storage controllers 1310a and 1310b. Although the NVMs 1320a and 1320b may include flash memories having a two-dimensional (2D) structure or a three-dimensional (3D) V-NAND structure, the NVMs 1320a and 1320b may include other types of NVMs, such as PRAM and/or RRAM.

The storage devices 1300a and 1300b may be physically separated from the main processor 1100 and included in the system 1000 or implemented in the same package as the main processor 1100. In addition, the storage devices 1300a and 1300b may have types of solid-state devices (SSDs) or memory cards and be removably combined with other components of the system 100 through an interface, such as the connecting interface 1480 that will be described below. The storage devices 1300a and 1300b may be devices to which a standard protocol, such as a universal flash storage (UFS), an embedded multi-media card (eMMC), or a non-volatile memory express (NVMe), is applied, without being limited thereto.

The image capturing device 1410 may capture still images or moving images. The image capturing device 1410 may include a camera, a camcorder, and/or a webcam.

The user input device 1420 may receive various types of data input by a user of the system 1000 and include a touch pad, a keypad, a keyboard, a mouse, and/or a microphone.

The sensor 1430 may detect various types of physical quantities, which may be obtained from the outside of the system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the system 1000 according to various communication protocols. The communication device 1440 may include an antenna, a transceiver, and/or a modem.

In some embodiments, the communication device 1440 may include the transmitter 11 of FIG. 1. For example, the communication device 1140 may include the transmitter 11 including the serializer 100 of FIG. 2 for serializing a signal generated in the system 1000.

The display 1450 and the speaker 1460 may serve as output devices configured to respectively output visual information and auditory information to the user of the system 1000.

The power supplying device 1470 may appropriately convert power supplied from a battery (not shown) embedded in the system 1000 and/or an external power source and supply the converted power to each of components of the system 1000.

The connecting interface 1480 may provide connection between the system 1000 and an external device, which is connected to the system 1000 and capable of transmitting and receiving data to and from the system 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

Figure 11:
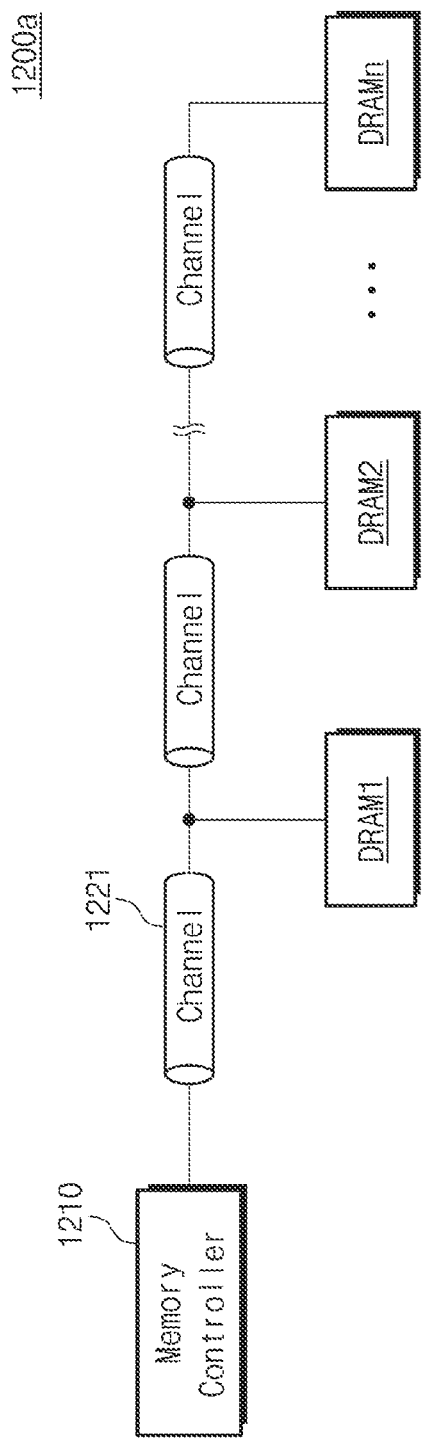
FIG. 11 illustrates a block diagram of a memory, according to some embodiments of the present disclosure.

FIG. 11 illustrates a block diagram of a memory device 1200a, according to some embodiments of the present disclosure. Referring to FIGS. 1, 2, 10, and 11, the transmitter 11 including the serializer 100 of FIG. 2 may be included in a semiconductor memory device such as the memory 1200a.

The memory 1200a may include a memory controller 1210 and n DRAMs DRAM1 to DRAMn (n being a natural number). The DRAMs DRAM1 to DRAMn may communicate with the memory 1200a through a channel (e.g., 1221). The memory controller 1210 and the DRAMs DRAM1 to DRAMn may include the transmitter 11 including the serializer 100 of FIG. 2. As such, the quality of serial communication between the DRAMs DRAM1 to DRAMn in the memory 1200a may be improved. For example, the intersymbol interference of the data signal output from each of the DRAMs DRAM1 to DRAMn may be prevented.

A multiplexer according to some embodiments of the present disclosure may adjust, in advance, a level of a voltage of a node electrically connected with an output terminal of the multiplexer, based on second data corresponding to a previous pulse of a first pulse as well as first data corresponding to the first pulse. Accordingly, a transition speed of an output signal may be improved and an intersymbol interference may decrease.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A multiplexer that selects one of a first to a fourth data signal in response to a first to a fourth pulse, the first to fourth pulses respectively correspond to the first to fourth data signals and sequentially toggle, the multiplexer comprising:
   a NAND gate configured to output a first gate signal in response to receiving the first data signal, a fourth complementary data signal that is a complementary signal of the fourth data signal, and the first pulse;
   a NOR gate configured to output a second gate signal in response to receiving the first data signal, the fourth complementary data signal, and a first complementary pulse complementary to the first pulse;
   a first transistor including a first terminal to which a first power supply voltage is applied, a gate that receives the first gate signal, and a second terminal connected with an output terminal of the multiplexer; and
   a second transistor including a first terminal connected with the output terminal of the multiplexer, a gate that receives the second gate signal, and a second terminal to which a ground voltage is applied, wherein:
   the first data signal corresponds to a rising edge of the first pulse, and
   the fourth complementary data signal corresponds to a rising edge of the fourth pulse.

2. The multiplexer of claim 1, wherein the NAND gate includes:
   a third transistor including a first terminal to which a second power supply voltage is applied, a gate to which the first pulse is applied, and a second terminal connected with the gate of the first transistor;
   a fourth transistor including a first terminal to which a third power supply voltage is applied, a gate to which the first data signal is applied, and a second terminal connected with the gate of the first transistor;
   a fifth transistor including a first terminal connected with the gate of the first transistor, a gate to which the first pulse is applied, and a second terminal connected with a first node;
   a sixth transistor including a first terminal connected with the first node, a gate to which the first data signal is applied, and a second first node to which the ground voltage is applied; and
   a seventh transistor including a first terminal connected with the first node, a gate to which the fourth complementary data signal is applied, and a second terminal to which the ground voltage is applied.

3. The multiplexer of claim 2, wherein the NAND gate further includes an eighth transistor including a first terminal to which a fourth power supply voltage is applied, a gate to which the first data signal is applied, and a second terminal connected with the first node.

4. The multiplexer of claim 3, wherein the seventh transistor is implemented with an NMOS transistor and the eighth transistor is implemented with a PMOS transistor.

5. The multiplexer of claim 1, wherein the NOR gate includes:
   a third transistor including a first terminal to which a second power supply voltage is applied, a gate to which the first data signal is applied, and a second terminal connected with a first node;
   a fourth transistor including a first terminal connected with the first node, a gate to which the first complementary pulse is applied, and a second terminal connected with the gate of the second transistor;
   a fifth transistor including a first terminal connected with the gate of the second transistor, a gate to which the first complementary pulse is applied, and a second terminal to which the ground voltage is applied;
   a sixth transistor including a first terminal connected with the gate of the second transistor, a gate to which the first data signal is applied, and a second terminal to which the ground voltage is applied; and
   a seventh transistor including a first terminal to which a third power supply voltage is applied, a gate to which the fourth complementary data signal is applied, and a second terminal connected with the first node.

6. The multiplexer of claim 5, wherein the NOR gate further includes an eighth transistor including a first terminal connected with the first node, a gate to which the first data signal is applied, and a second terminal to which the ground voltage is applied.

7. The multiplexer of claim 6, wherein the seventh transistor is implemented with a PMOS transistor and the eighth transistor is implemented with an NMOS transistor.

8. A serializer comprising:
   a clock multiplexer configured to generate first to fourth pulses based on first to fourth clocks, wherein the first to fourth clocks have a phase difference of 90 degrees with each other and the first to fourth pulses toggle sequentially; and
   a multiplexer configured to output an output signal, which is based on a first to a fourth data signal, in response to the first to fourth pulses and first to fourth complementary pulses respectively complementary to the first to fourth pulses, wherein:
   the first to fourth data signals correspond to the first to fourth pulses, respectively, the multiplexer includes:
a NAND gate configured to output a first gate signal in response to receiving the first data signal, a fourth complementary data signal complementary to the fourth data signal, and the first pulse; and
a NOR gate configured to output a second gate signal in response to receiving the first data signal, the fourth complementary data signal, and a first complementary pulse complementary to the first pulse, and
a level of the output signal is based on the first gate signal and the second gate signal.

9. The serializer of claim 8, wherein:
the NAND gate includes a first transistor including a first terminal to which the first gate signal is applied, a gate to which the first pulse is applied, and a second terminal connected with a first node, and
a level of a voltage of the first node falls in response to the fourth complementary data signal having a first logical value at a first rising edge of the fourth pulse.

10. The serializer of claim 9, wherein:
at a second rising edge of the first pulse following the first rising edge of the fourth pulse, the voltage of the first node is transferred to the first terminal of the first transistor, to which the first gate signal is applied, in response to the first data signal having a second logical value, and
the first logical value and the second logical value are different.

11. The serializer of claim 9, wherein at a second rising edge of the first pulse following the first rising edge of the fourth pulse, the level of the voltage of the first node rises in response to the first data signal having the first logical value.

12. The serializer of claim 8, wherein:
the NOR gate includes a first transistor including a first terminal connected with a first node, a gate to which the first complementary pulse is applied, and a second terminal to which the second gate signal is applied, and
a level of a voltage of the first node falls in response to the fourth complementary data signal having a first logical value at a first rising edge of the fourth pulse.

13. The serializer of claim 12, wherein:
at a second rising edge of the first pulse following the first rising edge of the fourth pulse, the voltage of the first node is transferred to the first terminal of the first transistor, to which the second gate signal is applied, in response to the first data signal having a second logical value, and
the first logical value and the second logical value are different.

14. The serializer of claim 12, wherein at a second rising edge of the first pulse following the first rising edge of the fourth pulse, the level of the voltage of the first node falls in response to the first data signal having the first logical value.

15. A serializer comprising:
a clock multiplexer configured to generate first to fourth pulses based on first to fourth clocks, wherein the first to fourth clocks have a phase difference of 90 degrees with each other and the first to fourth pulses toggle sequentially; and
a multiplexer configured to output an output signal, which is based on a first to a fourth data signal, in response to the first to fourth pulses and first to fourth complementary pulses respectively complementary to the first to fourth pulses, wherein:
the first to fourth data signals correspond to the first to fourth pulses, respectively, the multiplexer includes:
a NAND gate configured to output a first gate signal in response to receiving the first data signal, a fourth complementary data signal that is a complementary signal of the fourth data signal, and the first pulse;
a NOR gate configured to output a second gate signal in response to receiving the first data signal, the fourth complementary data signal, and a first complementary pulse complementary to the first pulse;
a first transistor including a first terminal to which a first power supply voltage is applied, a gate that receives the first gate signal, and a second terminal connected with an output terminal of the multiplexer; and
a second transistor including a first terminal connected with the output terminal of the multiplexer, a gate that receives the second gate signal, and a second terminal to which a ground voltage is applied,
the first data signal corresponds to a rising edge of the first pulse, and
the fourth complementary data signal corresponds to a rising edge of the fourth pulse.

16. The serializer of claim 15, wherein the NAND gate includes:
a third transistor including a first terminal to which a second power supply voltage is applied, a gate to which the first pulse is applied, and a second terminal connected with the gate of the first transistor;
a fourth transistor including a first terminal to which a third power supply voltage is applied, a gate to which the first data signal is applied, and a second terminal connected with the gate of the first transistor;
a fifth transistor including a first terminal connected with the gate of the first transistor, a gate to which the first pulse is applied, and a second terminal connected with a first node;
a sixth transistor including a first terminal connected with the first node, a gate to which the first data signal is applied, and a second terminal to which the ground voltage is applied; and
a seventh transistor including a first terminal connected with the first node, a gate to which the fourth complementary data signal is applied, and a second terminal to which the ground voltage is applied.

17. The serializer of claim 16, wherein the NAND gate further includes an eighth transistor including a first terminal to which a fourth power supply voltage is applied, a gate to which the first data signal is applied, and a second terminal connected with the first node.

18. The serializer of claim 15, wherein the NOR gate includes:
a third transistor including a first terminal to which a second power supply voltage is applied, a gate to which the first data signal is applied, and a second terminal connected with a first node;
a fourth transistor including a first terminal connected with the first node, a gate to which the first complementary pulse is applied, and a second terminal connected with the gate of the second transistor;
a fifth transistor including a first terminal connected with the gate of the second transistor, a gate to which the first complementary pulse is applied, and a second terminal to which the ground voltage is applied;
a sixth transistor including a first terminal connected with the gate of the second transistor, a gate to which the first data signal is applied, and a second terminal to which the ground voltage is applied; and a seventh transistor including a first terminal to which a third power supply voltage is applied, a gate to which the fourth complementary data signal is applied, and a second terminal connected with the first node.

19. The serializer of claim 18, wherein the NOR gate further includes an eighth transistor including a first terminal connected with the first node, a gate to which the first data signal is applied, and a second terminal to which the ground voltage is applied.

20. The serializer of claim 15, wherein:

the NAND gate includes a third transistor including a first terminal to which the first gate signal is applied, a gate to which the first pulse is applied, and a second terminal connected with a first node, the NOR gate includes a fourth transistor including a first terminal connected with a second node, a gate to which the first complementary pulse is applied, and a second terminal to which the second gate signal is applied, and in response to the fourth complementary data signal having a first logical value at a first rising edge of the fourth pulse, a level of the first node falls and a level of the second node rises.

* * * * *